(12) United States Patent
Kawanishi et al.

(10) Patent No.: US 6,885,085 B2
(45) Date of Patent: Apr. 26, 2005

(54) SEMICONDUCTOR LASER DEVICE

(75) Inventors: Hidenori Kawanishi, Nara (JP); Kei Yamamoto, Nara (JP); Fumihiro Konushi, Nara (JP); Yoshie Fujishiro, Tenri (JP); Toshihiko Yoshida, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 2 days.

(21) Appl. No.: 10/351,609

(22) Filed: Jan. 27, 2003

(65) Prior Publication Data

US 2003/0151043 A1 Aug. 14, 2003

(30) Foreign Application Priority Data

Jan. 28, 2002 (JP) ........................................ 2002-018198
Nov. 7, 2002 (JP) ........................................ 2002-323627

(51) Int. Cl.[7] ........................................ H01L 23/552
(52) U.S. Cl. ........................ 257/660; 257/431; 257/17; 372/43
(58) Field of Search ................................ 257/431, 660, 257/17; 372/43–50, 75; 438/FOR 289

(56) References Cited

U.S. PATENT DOCUMENTS 5,644,587 A  7/1997 Kaneno et al. ................ 372/45
6,127,691 A * 10/2000 Fukunaga et al. ............ 257/17
6,327,293 B1 * 12/2001 Salokatve et al. ............ 372/96

FOREIGN PATENT DOCUMENTS

| EP | 1 104 057 | 5/2001 |
|----|-----------|--------|
| JP | 10-4237 A | 1/1998 |
| JP | 11-220224 A | 8/1999 |

* cited by examiner

Primary Examiner—Nathan J. Flynn
Assistant Examiner—Scott R. Wilson
(74) Attorney, Agent, or Firm—Nixon & Vanderhye P.C.

(57) ABSTRACT

A semiconductor laser device has an n-type AlGaAs first cladding layer 2, a multiple quantum well active layer 3, and a p-type AlGaAs second cladding layer 4 formed in this order and supported by an n-type GaAs substrate 1. The multiple quantum well active layer 3 has two quantum well layers 3a and barrier layers 3b provided on both sides of each quantum well layer 3a. The quantum well layers 3a are each made of $In_{1-v1}Ga_{v1}As_{1-w1}P_{w1}$, while the barrier layers 3b are each made of $In_{1-v2}Ga_{v2}As_{1-w2}P_{w2}$. Here, v1 and v2 satisfy v1<v2, while w1 and w2 satisfy w1<w2. The barrier layers have a tensile strain with respect to the GaAs substrate, while the well layers have a compressive strain with respect to the GaAs substrate.

12 Claims, 9 Drawing Sheets

SEMICONDUCTOR LASER DEVICE

BACKGROUND OF THE INVENTION

The present invention relates to a semiconductor laser device.

Figure 7:
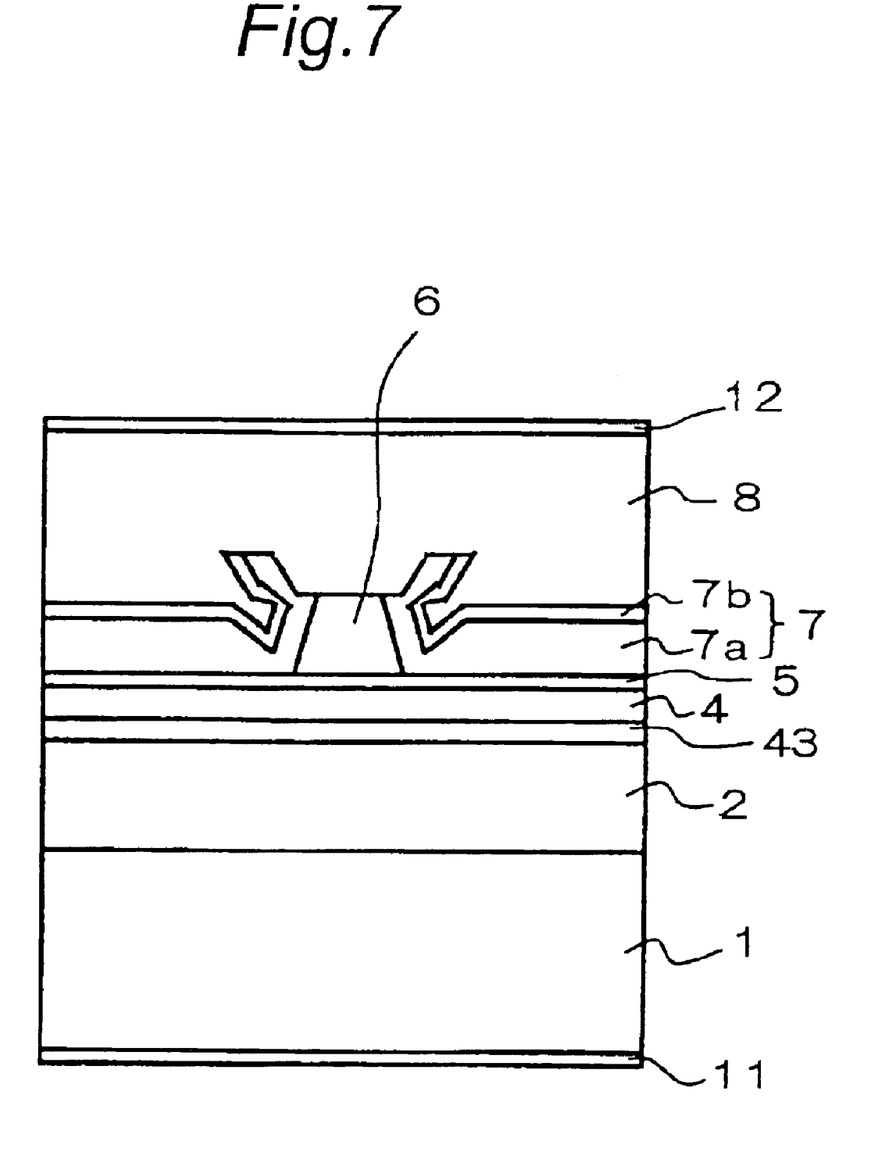
FIG. 7 is a view showing layer structure of a conventional semiconductor laser device seen from an end face side.

Conventionally, as semiconductor laser devices that continuously produce output of as high as 150 mW or more with emission wavelength of 780 nm, there have been those with the structure shown in FIG. 7. FIG. 7 is a view of an end face of a semiconductor laser device, showing layer structure of crystal of the semiconductor laser device, in which the layer structure extends in a direction vertical to a surface of the drawing sheet.

In FIG. 7, there are shown an n-type GaAs substrate 1, an n-type $Al_xGa_{1-x}As$ first cladding layer 2, an active layer 43, a p-type $Al_xGa_{1-x}As$ second cladding layer 4, a p-type GaAs etching stopper layer 5, a stripe-shaped p-type $Al_xGa_{1-x}As$ third cladding layer 6, an n-type GaAs current blocking layer 7 that forms a stripe-shaped notch portion, a p-type GaAs contact layer 8, an n-side electrode 11, and a p-side electrode 12.

The p-type GaAs contact layer 8 is formed so as to cover the p-type $Al_xGa_{1-x}As$ third cladding layer 6 and the n-type GaAs current blocking layer 7. The p-type $Al_xGa_{1-x}As$ third cladding layer 6 fills the stripe-shaped notch portion of the n-type GaAs current blocking layer 7. The current blocking layer 7 is composed of an n-type $Al_xGa_{1-x}As$ first buried layer 7a formed on the etching stopper layer 5, and an n-type GaAs second buried layer 7b formed on the first buried layer 7a. The term "stripe-shaped" refers to a narrow structure extending in a vertical direction to the surface of the drawing sheet. It is noted that the range of x is 0<x<1.

Figure 8:
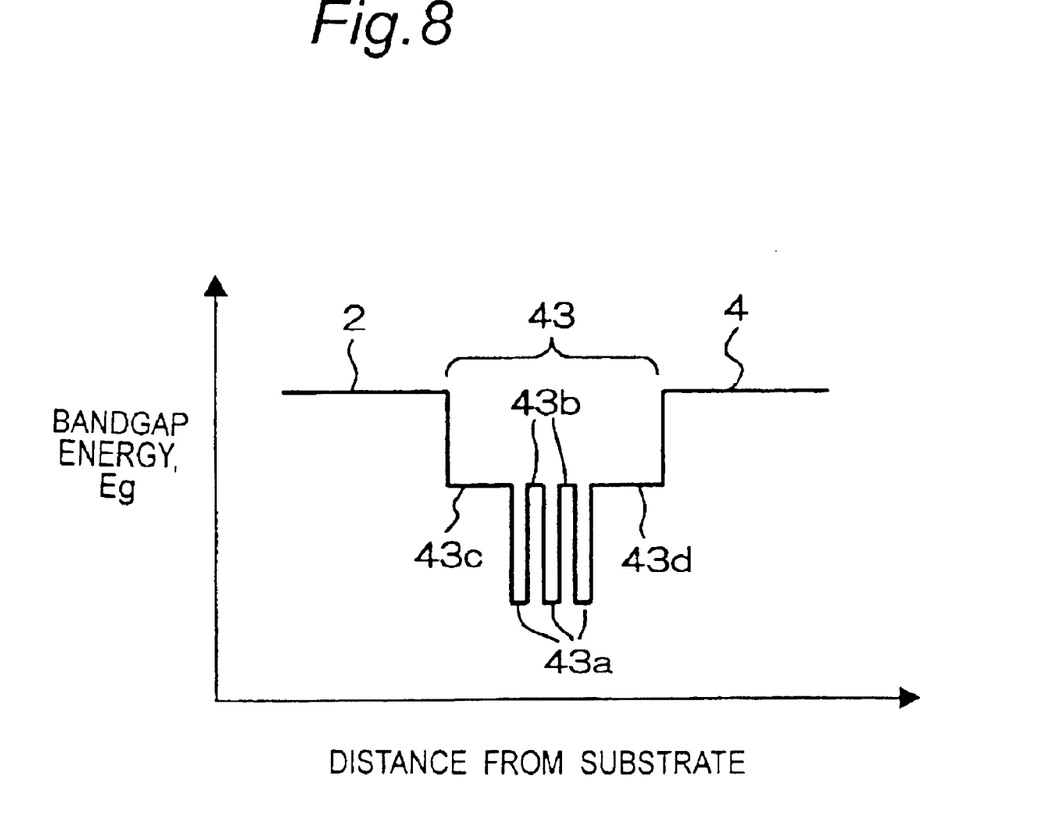
FIG. 8 is a view showing thickness and bandgap energy of each of layers constituting an active layer of the conventional semiconductor laser device, as well as positional relationship between the layers.

As the active layer 43, there is adopted a layer with so-called multiple quantum well structure. FIG. 8 shows details of the multiple quantum well structure. In FIG. 8, the vertical axis represents Eg (bandgap energy) of each layer that changes in response to a composition ratio x of Al, whereas the horizontal axis represents a distance from the substrate 1 to the layers. The active layer 43 has a well layer 43a called a quantum well. For the well layer 43a, a crystal is used which has an Al ratio smaller than those of barrier layers 43b and guide layers 43c, 43d on both sides. This makes Eg of the well layer 43a smaller than Eg of the barrier layers 43b and the guide layers 43c, 43d, which makes Eg of the well layer 43a look like a well. Also, a thickness of the well layer 43a is around 200 Å or less, that is equal to or sufficiently smaller than the de Broglie wavelength of electrons, so that the well layer 43a is called a quantum well. Also, the term "multiple" indicates that a plurality of well layers 43a separated by the barrier layers 43b are used.

The guide layers 43c, 43d are layers for adjusting the level of confinement of laser light in the direction of the horizontal axis of FIG. 8. For simplifying the manufacturing process, guide layers having a composition identical to that of the barrier layers 43b are often used.

According to the above-structured semiconductor laser device, carriers (electrons and holes) injected from the electrodes 11, 12 are confined in the well layers 43a, which are small in Eg, so as to be efficiently recombined. Also in the well layers 43a, high luminous efficiency is obtained by quantum effect. This provides advantages such as reduction of oscillation threshold current Ith, and increase of external quantum efficiency η. Here, the emission wavelength λ has relationship with Eg of the well layer 43a that λ is approximately equal to 1.4/Eg. It is noted that a unit of the emission wavelength λ is μm and a unit of Eg is eV.

If the oscillation threshold current Ith is low and the external quantum efficiency η is high, optical output P0 is equal to (Id−Ith)×η where Id is a driving current, so that large optical output P0 can be provided without considerable increase of the driving current Id. Therefore, larger optical output P0 can be achieved with the same driving current.

However, there has been a problem that a luminous layer of the conventional semiconductor laser device is made of GaAlAs, so that if oxygen and/or moisture exists around the semiconductor laser device, constituent Al atoms of the well layer 43a are photochemically reacted with the oxygen and/or moisture by optical energy of laser and oxidized, and thereby destroy crystal structure of the well layer 43a, which tends to deteriorate characteristics of a laser device.

One solution to this problem may be to use a crystal containing no Al in the well layer 43a. In the case of using the semiconductor laser device as a light source for optical disc systems such as CD-R (compact disc recordable) and CD-RW (compact disc rewritable), a laser emission wavelength of the semiconductor laser device should be approx. 780 nm.

Figure 3:
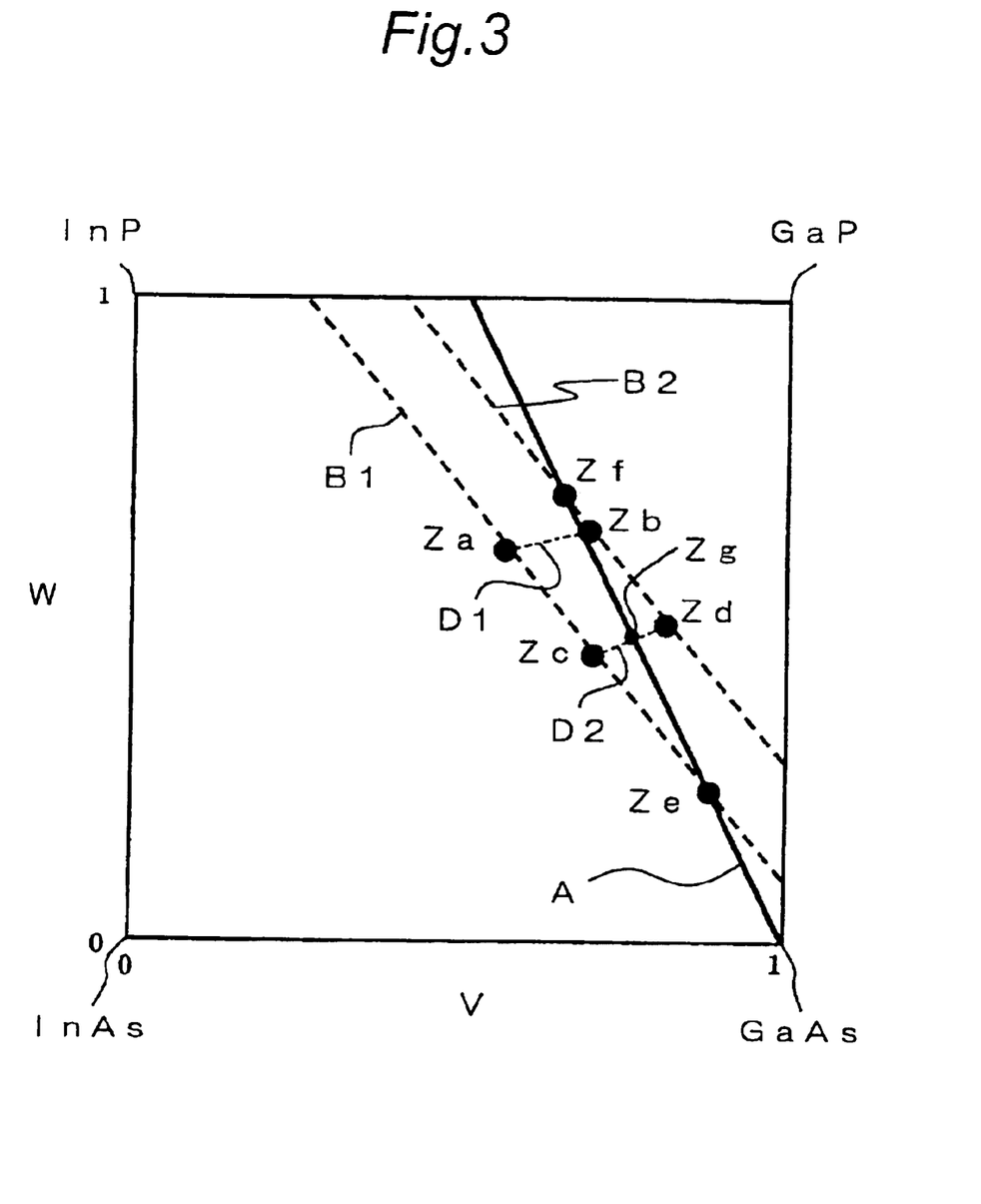
FIG. 3 is a view showing composition of III-V-group quaternary mixed crystal $In_{1-v}Ga_vAs_{1-w}P_w$ (0<v<1, 0<w<1)

FIG. 3 is a view showing composition of III-V-group quaternary mixed crystal $In_{1-v}Ga_vAs_{1-w}P_w$ (0<v<1, 0<w<1) that is assumed as a prospective material of the above-described semiconductor laser device.

In FIG. 3, the vertical axis denotes a proportion of P in V-group elements in the mixed crystal, whereas the horizontal axis denotes a proportion of Ga in III-group elements in the mixed crystal. Four corners of the shown quadrangle indicate, clockwise from the upper right corner, GaP, GaAs, InAs, and InP, each of which is a binary mixed crystal. Also, four sides of the quadrangle indicate, clockwise from the right-hand side, $GaAs_wP_{1-w}$, $In_{1-v}Ga_vAs$, $InAs_{1-w}P_w$, and $In_{1-v}Ga_vP$, each of which is a ternary mixed crystal. The inside of the quadrangle indicates $In_{1-v}Ga_vAs_{1-w}P_w$, a quaternary mixed crystal.

Solid line A in FIG. 3 is a line connecting compositions having the same lattice constant, a, of the crystal, i.e., the solid line A is a lattice constant line. Since the solid line A passes a lower right GaAs point, it represents a group of compositions that are lattice-matched with the GaAs substrate. Broken lines B1 and B2 in FIG. 3 are lines connecting compositions having the same Eg of the crystal, i.e., the broken lines B1 and B2 are Eg lines. The lines indicate that if, for example, a crystal whose composition is on the line B1 is used as a well layer, an emission wavelength of the semiconductor laser is approx. 780 nm.

In FIG. 3, the lattice constant a of the crystal becomes smaller as going toward upper right side in approximate vertical direction from the solid line A, and becomes larger toward the lower left side of line A. The Eg of the crystal becomes larger toward upper right side in vertical direction from the broken line B1 or B2, and becomes smaller toward the lower left side. Therefore, the emission wavelength becomes shorter toward the upper right side and becomes longer toward the lower left side.

As for the active layer of the semiconductor laser device, a layer in a portion high in laser light intensity preferably contains no Al. More specifically, not only well layers but also barrier layers preferably contain no Al. Therefore, for manufacturing a semiconductor laser with an emission wavelength of 780 nm, there may be used as a well layer an $In_{1-v1}Ga_{v1}As_{1-w1}P_{w1}$ (0<v1<1, 0<w1<1) crystal whose composition is on the broken line B1 of FIG. 3, and as a barrier layer there may be used an $In_{1-v2}Ga_{v2}As_{1-w2}P_{w2}$ (0<v2<1, 0<w2<1) crystal whose composition is on the broken line B2 of FIG. 3 and whose bandgap is larger than the well layer.

However, since there has been no clear guiding principle of combination of v1, v2, w1, and w2, such semiconductor laser has not yet been put into practice to date.

SUMMARY OF THE INVENTION

Accordingly, it is an object of the present invention to provide a semiconductor laser device capable of producing higher optical output for a practically sufficient time even if Al is not contained in an active layer thereof.

In order to accomplish the above object, according to the present invention, there is provided a semiconductor laser device having a first-conductivity-type first cladding layer, an active layer, and a second-conductivity-type second cladding layer supported by a first-conductivity-type GaAs substrate and formed in this order, each of said layers being made of a III-V-group compound semiconductor, the active layer having at least one well layer and barrier layers having an energy bandgap larger than the well layer, the well layer being interposed between the barrier layers, wherein the well layer and the barrier layers each include P (phosphor) and As (arsenic) as V-group elements and Ga (gallium) and In (indium) as III-group elements;

a proportion of P in the V-group elements in the barrier layers is larger than a proportion of P in the V-group elements in the well layer;

a proportion of In in the III-group elements in the barrier layers is smaller than a proportion of In in the III-group elements in the well layer;

the barrier layers has a tensile strain with respect to the GaAs substrate;

the well layer has a compressive strain with respect to the GaAs substrate; and the semiconductor laser device has an emission wavelength of approx. 780 nm.

According to the above-structured semiconductor laser device, the proportion of P (hereinafter, also referred to as "P ratio") in the V-group elements in the barrier layer is made larger than the proportion of P in the V-group elements in the well layer, while the proportion of In (hereinafter, also referred to as "In ratio") in the III-group elements in the barrier layer is made smaller than the proportion of In in the III-group elements in the well layer. Under this condition, because the barrier layer has a tensile strain with respect to the GaAs substrate, whereas the well layer has a compressive strain with respect to the GaAs substrate, higher optical output is producible for a practically sufficient operating time even if Al (aluminum) is not contained in the active layer. Therefore, the semiconductor laser device of the present invention can be used as a light source for optical disc systems for discs such as CD-R and CD-RW.

In one embodiment, the In ratio in the III-group elements in the barrier layer is 0.15 or less.

In one embodiment, an absolute value of the tensile strain of the barrier layers with respect to the GaAs substrate is larger than an absolute value of the compressive strain of the well layer with respect to the GaAs substrate.

In one embodiment, two or more well layers are provided and a barrier layer is present between the adjacent well layers.

According to the semiconductor laser device in the above embodiment, due to the provision of the two or more well layers with a barrier layer interposed between the adjacent well layers, it is possible to form a far-field pattern of output laser light into a shape suitable for optical disc systems.

In one embodiment, the semiconductor laser device further includes AlGaAs guide layers each formed between an active area composed of the well and barrier layers and the first and second cladding layers, respectively, and a proportion of Al in the AlGaAs guide layer is 0.3 or more.

In the above embodiment, due to the provision of the AlGaAs guide layer having the Al ratio of 0.3 or more between the active area and each of the first and second cladding layers, the device is able to perform a stable operation with a high output even at high temperatures of 70° C. or more.

In one embodiment, the semiconductor laser device further includes an AlGaAs carrier block layer formed between one AlGaAs guide layer and the second cladding layer. The proportion of Al in the AlGaAs carrier block layer is 0.6 or more and less than 0.85. Also, the first conductivity type is an n type, and the second conductivity type is a p type.

In this case also, a stable operation with a high output is achievable even at high temperatures of 70° C. or more In one embodiment, the second cladding layer has an Al ratio of 0.5 or more.

According to the semiconductor laser device in the above embodiment, due to the Al ratio in the second cladding layer being 0.5 or more, stable operation of the device with a high output is achievable even at high temperatures of 70° C. or more.

In one embodiment, the semiconductor laser device further has a second-conductivity-type GaAs etching stopper layer formed on the second cladding layer, a first-conductivity-type current blocking layer formed on the GaAs etching stopper layer and defining a stripe-shaped notch portion, a second-conductivity-type third cladding layer filling the stripe-shaped notch portion, and a contact layer formed so as to cover the third cladding layer and the current blocking layer.

The semiconductor laser device in the above embodiment, which has the second-conductivity-type GaAs etching stopper layer, the first-conductivity-type current blocking layer, the second-conductivity-type third cladding layer, and the contact layer, on the second cladding layer stacked in sequence on the second cladding layer, can be used as a laser light source that allows a faster operation of optical disc systems directed to discs such as CD-R and CD-RW.

In one embodiment, the at least one well layer and the barrier layers are intermixed in a portion of the active layer adjacent to at least one of two end faces of the device.

In this embodiment, the intermixing between the at least one well layer and the barrier layers in a portion adjacent to at least one end face of the active layer enables the semiconductor laser device to produce still higher optical output.

BRIEF DESCRIPTION OF THE DRAWINGS

The present invention will become more fully understood from the detailed description given hereinbelow and the accompanying drawings which are given by way of illustration only, and thus are hot intended to limit the present invention, and wherein:

FIG. 5(a) is a view showing layer structure of a semiconductor laser device in a third embodiment of the present invention seen from an end face side, while

DETAILED DESCRIPTION OF THE PREFERRED EMBODIMENTS (First Embodiment)

Figure 1:
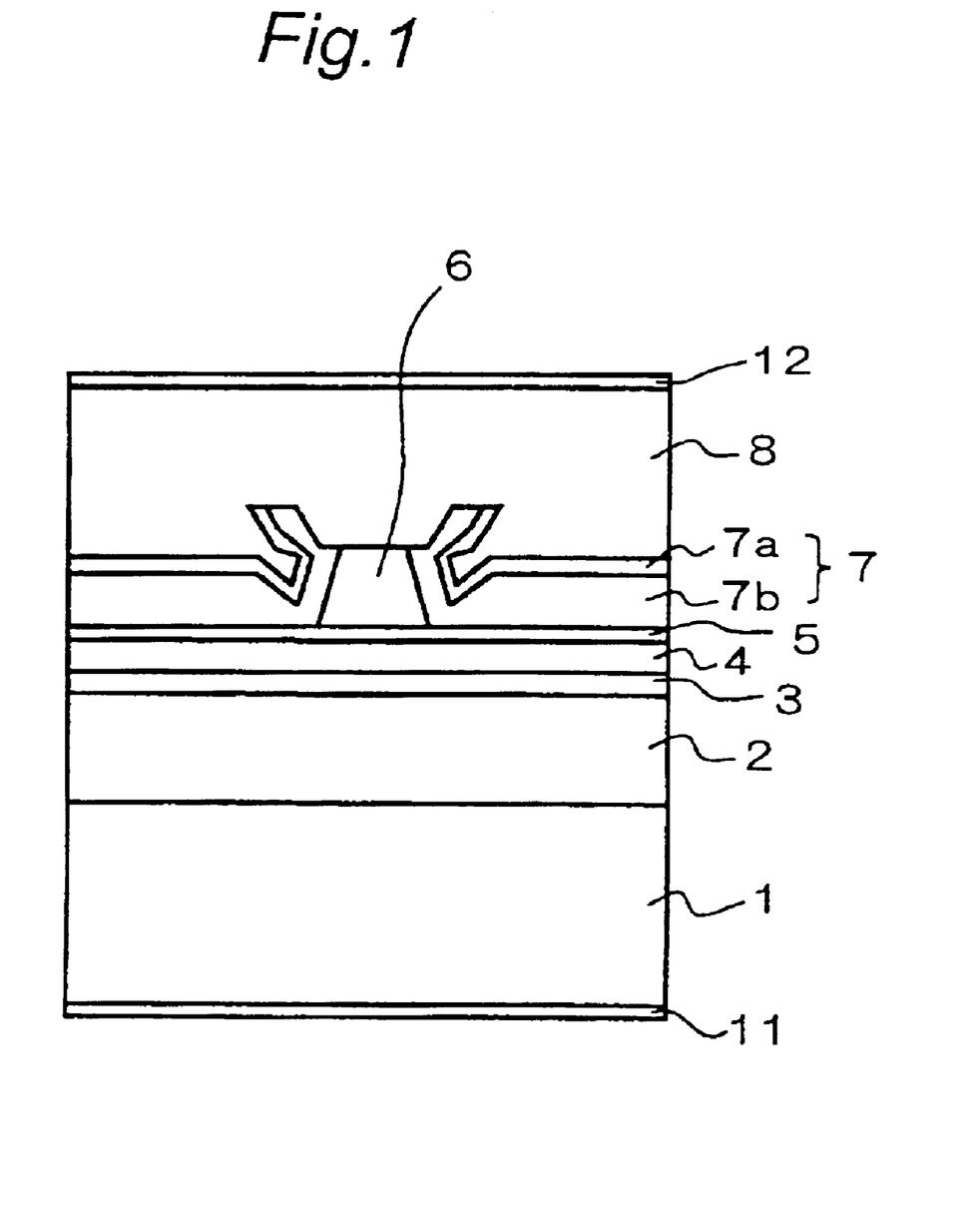
FIG. 1 is a view showing layer structure of a semiconductor laser device in a first embodiment of the present invention seen from an end face side.

FIG. 1 is a view showing layer structure of a semiconductor laser device in a first embodiment of the present invention seen from an end face side. In FIG. 1, components identical or similar to those shown in FIG. 7 are designated by reference numerals identical to those in FIG. 7.

Figure 2:
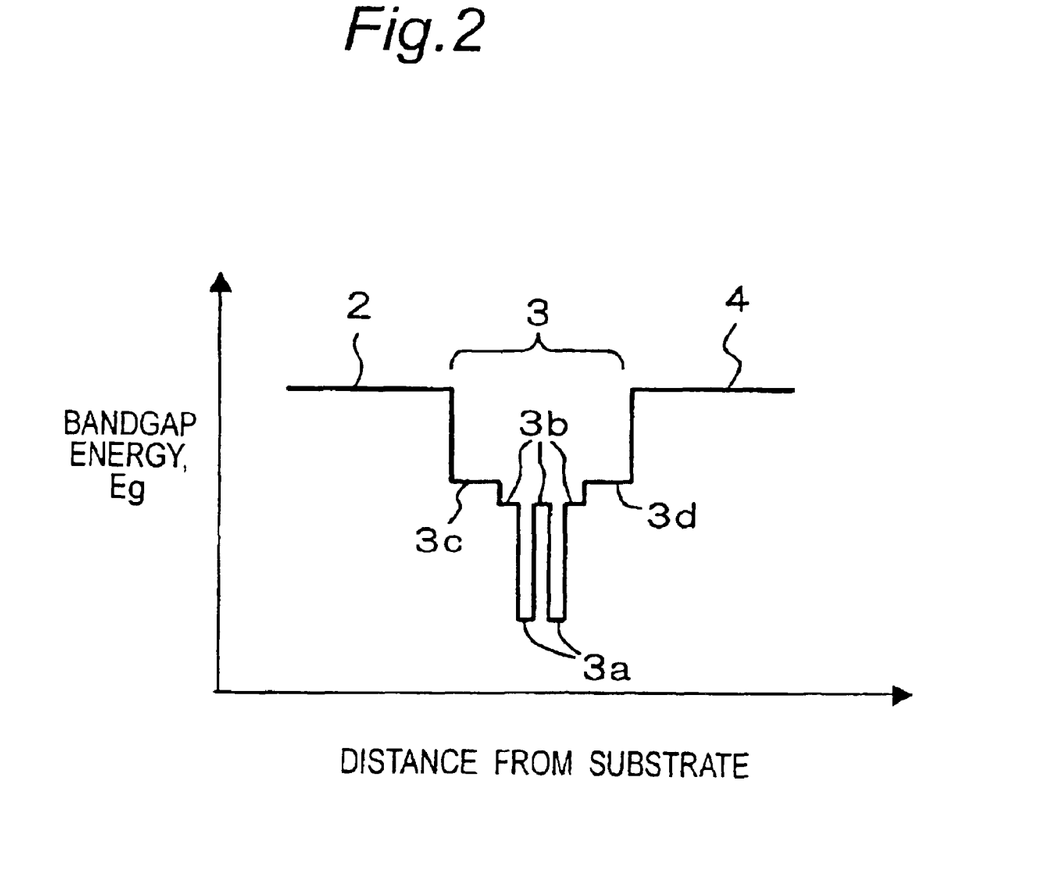
FIG. 2 is a view showing thickness and bandgap energy of each of layers constituting an active layer of the semiconductor laser device in the first embodiment, as well as positional relationship between the layers.

FIG. 2 is a view showing details of a multiple quantum well active layer 3 of the semiconductor laser device in the first embodiment. In FIG. 2, the vertical axis represents Eg of crystals constituting each layer, whereas the horizontal axis indicates a distance from the substrate.

The multiple quantum well active layer 3 has two quantum well layers 3a and barrier layers 3b provided on both sides of each quantum well layer 3a. The quantum well layer 3a is made of $In_{1-v1}Ga_{v1}As_{1-w1}P_{w1}$, while the barrier layer 3b is made of $In_{1-v2}Ga_{v2}As_{1-w2}P_{w2}$. Here, v1 and v2 satisfy v1<v2, while w1 and w2 satisfy w1<w2.

Hereinbelow, detailed description will be given of the relationship between the proportions v1 and w1 in the composition of the quantum well layer 3a, and the relationship between the proportions v2 and w2 in the composition of the barrier layer 3b.

For example, in the case where the compositions of the quantum well layer 3a and the barrier layer 3b correspond to the compositions at both ends of a broken line segment D1, it is preferable that the composition of the quantum well layer 3a is set at point Za and the composition of the barrier layer 3b is set at point Zb. In the case, for example, where the compositions of the quantum well layer 3a and the barrier layer 3b correspond to the compositions at both ends of a broken line segment D2, it is preferable that the composition of the quantum well layer 3a is set at point Zc and the composition of the barrier layer 3b is set at point Zd.

Hereinbelow, detailed description will be given of the relation between the point Za and the point Zb, and the relation between the point Zc and the point Zd.

As described above, the bandgap energy Eg of the barrier layer 3b should be larger than the bandgap energy Eg of the quantum well layer 3a. In the case where the substrate is a GaAs substrate, the composition of a crystal having a crystal lattice size equal to a crystal lattice size of the substrate is shown by the solid line A. Crystals having compositions positioned on the solid line A are lattice-matched with the substrate so as to be in the state without distortion. Among crystals having a composition in the range shown in FIG. 3, those in a central region of the drawing are known to be most difficult to manufacture. This region is generally called a miscibility gap region. In order to use strainless crystals as the quantum well layer 3a as well as the barrier layer 3b, the inventors of the present invention experimentally manufactured a semiconductor laser device with the crystal composition of the quantum well layer 3a being at point Ze, and the crystal composition of the barrier layer 3b being at point Zf, as a result of which the threshold current became as high as 70 mA or more, meaning that a good device was not achieved. The point Zf is out of the miscibility gap region and therefore a surface considered good from the viewpoint of crystal growth was obtained. However, it was confirmed that good device characteristics could not be obtained in reality. This is a phenomenon that defies explanation within the framework of conventional understanding of the crystal growth.

As to the barrier layer 3b, composition with strain may be acceptable. When a lattice constant of the substrate is a1, a lattice constant of a crystal is a2, and $\Delta a = a2-a1$, a strain Dis in the crystal is defined as $Dis = \Delta a/a1$, and typically shown in %. Selecting the composition with a large absolute value of strain Dis is equal to selecting the composition corresponding to as far a point as possible in a vertical direction from the solid line A in the drawing. It is known that if an absolute value of strain Dis is too large, the crystal is destroyed by internal stress, which causes problems that, in manufacturing optical devices such as semiconductor lasers and LED, light is absorbed by defects generated by the crystal destruction, carriers are trapped by the defects and unable to contribute to light emission, and performance of light devices is deteriorated. The upper right side from the solid line A is a direction with larger Eg, where the size of strain Dis has a negative value, so that tensile strain is generated. On the contrary, the lower left side from the slid line A is a direction with smaller Eg, where the size of strain Dis becomes a positive value, so that compressive strain is generated.

For enabling the semiconductor laser device to stably operate as a 150 mW to 200 mW high-power laser for high-speed CD-R, not only crystallinity but also temperature characteristics are quite important. There are various methods for improving the temperature characteristics, and the most important parameter or factor therefor is an energy gap difference between the quantum well layer 3a and the barrier layer 3b. However, in a conventional 780 nm-band laser, that is, a laser in which InGaAsP on the GaAs substrate is applied to both the quantum well layers and the barrier layers, there has not been a clear guiding principle regarding combination of InGaAsP compositions capable of satisfying both the above-stated crystallinity and the temperature characteristics, namely, a large energy gap difference.

As a result of keen examination of the conventional situation by the inventors of the present invention, it was found out that defects of a crystal to be grown could be reduced and an energy gap difference between the quantum well layer 3a and the barrier layer 3b could be increased as far as possible by satisfying the conditions that: a proportion of P in the V-group elements in the barrier layer 3b is made larger than a proportion of P in the V-group elements in the quantum well layer 3a; a proportion of In in the III-group elements in the barrier layer 3b is made smaller than a proportion of In in the III-group elements in the quantum well layer 3a; the barrier layer 3b has a tensile strain with respect to the GaAs substrate 1; and the quantum well layer 3a has a compressive strain with respect to the GaAs substrate 1.

More preferably, the proportion of In, i.e., the In ratio, in the III-group elements in the barrier layer 3b may be set to 0.15 or less. The inventors of the present invention confirmed that this setting considerably increased characteristics of the device.

It was also found out that it was preferable to satisfy a condition that an absolute value of the tensile strain of the barrier layer 3b with respect to the GaAs substrate 1 is larger that an absolute value of the compressive strain of the well layer with respect to the GaAs substrate.

For example, if the composition of the quantum well layer 3a is set at point Za, the composition of the barrier layer 3b may be set at point Zb, whereas if the composition of the quantum well layer 3a is set at point Zc, the composition of the barrier layer 3b may be set at point Zd. Which point is better depends on equipment for crystal growth. Generally, higher substrate temperatures at the time of growing crystals enable growth of good crystals whose compositions are in the vicinity of the center of the drawing. On the contrary, with lower substrate temperatures at the time of growing crystals, crystal compositions at which crystal defects take place are shifted to the lower right of the drawing. Though the substrate temperature could not be increased without limit, as high a temperature as possible is preferable. Under this condition, a proportion of In in the III-group elements in the barrier layer 3b crystal is preferably set to 15% or less. The reason thereof has not yet clarified so far, though it is considered that the phenomenon is peculiar to 780 nm-band semiconductor lasers.

In the semiconductor laser device in the first embodiment, AlGaAs guide layers 3c, 3d having an energy bandgap larger than that of the barrier layers are provided outside the barrier layers 3b for the following reason.

It is known that an absolute value of the size of strain which causes destruction of a crystal is inversely proportional to the thickness of the crystal. In order to control confinement of laser light by layers like the guide layers 3c, 3d, the layer thickness should be increased up to around 0.01 $\mu$m to 0.1 $\mu$m, and therefore the strain with respect to the substrate 1 is preferably small. Decreasing the strain and increasing the bandgap energy Eg as stated above is to create a crystal having a composition at an upper left point on the solid line B2. As described above, however, it is impossible to grow a defectless crystal with such a composition. Semiconductor lasers for CD-R, which are required to perform a high power operation, have an injection amount of carriers considerably larger than a conventional amount. Eventually, for operating the semiconductor lasers in good conditions even at high temperatures, it is necessary to increase an energy gap difference between the quantum well layer and the barrier layer, as well as to increase Eg of a layer outside the quantum well layer so as to prevent carriers leaked from the quantum well layer from spreading to the outside of a cladding. Accordingly, a guide layer is introduced, and an AlGaAs crystal having a large Eg and a lattice constant equal to that of the GaAs substrate is used as a material of the guide layer. In InGaAsP layers on the GaAs substrate, unlike AlGaAs crystals conventionally used for a 780 nm band, a large energy gap difference between the quantum well layer and the barrier layer is not obtainable. Also, since in InGaAsP crystals, distribution of a lowest energy level and higher levels in the quantum well layer, which has a close relationship with carrier leakage, is different from that in the AlGaAs crystals, temperature characteristics due to the oscillation threshold current Ith as well as a level of carrier leakage in the state of high optical output and high current injection are also different from those of the AlGaAs crystals. However, no optimized measures have been taken for preventing the leakage.

Accordingly, in the above-mentioned 780 nm-band InGaAsP laser structure, device characteristics were examined with the composition of the AlGaAs guide layers 3c, 3d being changed. The result indicated that with the Al ratio being less than 0.3, a TO value representing the temperature characteristics was 70 k or less at 25° C. to 85° C., whereas with the Al ratio being 0.3 or more, the temperature characteristics were improved. Particularly when the Al ratio in the compositions of the AlGaAs guide layers 3c, 3d was 0.4 or more, it was confirmed that the TO value was as good as 130 k or more. These TO values were obtained when the proportion x of Al in the p-type $Al_xGa_{1-x}As$ second cladding layer 4 was fixed to 0.48. When the proportion of Al in part of the AlGaAs guide layers 3c, 3d was increased up to around 0.5, similar results were obtained.

Even when Eg of the layers other than the AlGaAs guide layers 3c, 3d was increased, a similar effect of improving the temperature characteristics to the above-stated data was confirmed. In order to obtain layer conditions suitable for improving the temperature characteristics of semiconductor lasers having a 780 nm-band InGaAsP quantum well active layer, there were manufactured devices based on the structure of the first embodiment in which layers other than the guide layers, such as a cladding layer (p side) and a carrier blocking layer, had differently-set composition ratios, as described later. As a result of examining these devices, increase of the temperature characteristics value TO similar to the case of increasing the Al ratio of the guide layer was confirmed under specific conditions.

First, description is given of an experimental result in the case where the composition in the cladding layer is changed. There was manufactured a device with the proportion of Al (Al ratio) in the AlGaAs guide layers 3c, 3d being fixed to 0.4 and the Al ratio in the p-type $Al_xGa_{1-x}As$ second cladding layer 4 being changed, and characteristics thereof were examined. As a result, it was confirmed that setting the Al ratio in the p-type $Al_xGa_{1-x}As$ second cladding layer 4 to 0.5 or more further improved the TO value. For example, if the Al ratio is set to 0.6, the TO value is improved to be 150 k, and if the Al ratio is set to 0.7, the TO value is improved to be 200 k.

Next, description is given of a result of introducing a carrier block layer. The Al ratio in the composition of the p-type $Al_xGa_{1-x}As$ second cladding layer 4 was fixed to 0.5, and a 7 nm-thick p-type GaAlAs (its Al ratio being 0.7) carrier block layer was inserted between the p-type $Al_xGa_{1-x}As$ second cladding layer 4 and the GaAlAs guide layer 3d, as a result of which the TO value was improved up to 180 K. As for carrier block layers with other Al ratios, when the Al ratio was from about 0.6 to 0.85, there was obtained a temperature characteristics improvement effect same as that in the case where the Al ratio in the p-type GaAlAs carrier block layer was 0.7. Further, it was also confirmed that the temperature characteristics were improved in the GRIN (Graded Index) structure in which the composition of the GaAlAs guide layers 3c, 3d is continuously changed so as for the Al ratio to be gradually increased from the barrier layer toward the cladding layer, and in the structure with phased changes of the composition.

The above-stated results have clarified that, in the 780 nm-band semiconductor laser device of the present invention having no Al in the active layer, it is extremely important for securing good temperature characteristics to use AlGaAs as materials of the p-side guide layer and cladding layer and to properly set the Al ratios as described above.

Also, although it is quite important for improving the temperature characteristics of the device to secure a sufficiently large light confinement coefficient that determines light gain in the quantum well layer, it was found out that because a semiconductor laser having a 780 nm-band InGaAsP quantum well layer was different in band structure from a semiconductor laser having a AlGaAs well layer as described before, so that optimum values of Fermi level and a confinement coefficient were also largely different. As a result of experimentally manufacturing devices and examining the characteristics thereof, it was found out that designing optics so that in total light intensity distribution, 4% or more light was present in the quantum well layer made it possible to accomplish good temperature characteristics and threshold current characteristics. In actual devices, the optimum confinement coefficient is fulfilled by increasing a layer thickness of each quantum well layer and/or increasing the number of quantum well layers as well as changing the form of light itself.

As stated above, the semiconductor laser device in the first embodiment, to which the combination of InGaAsP materials in the quantum well layer and the barrier layer as well as the experimentally obtained means for improving the temperature characteristics of layers other than the quantum well layer and the barrier layer is applied, can stably operate as a 150 mW to 200 mW-class 780 nm-band InGaAsP semiconductor laser device for high-speed CD-R.

The following description discusses one example of the actual layer structure of the first embodiment with reference to FIGS. 1 and 2.

In FIG. 1, there are shown an n-type GaAs substrate 1, an n-type $Al_{0.45}Ga_{0.55}As$ first cladding layer 2 (thickness of 3.0 $\mu$m), a multiple quantum well active layer 3 (emission wavelength of 0.78 $\mu$m), a p-type $Al_{0.49}Ga_{0.51}As$ second cladding layer 4 (thickness of 0.1967 $\mu$m), a p-type GaAs etching stopper layer 5 (thickness of 3 nm), and a p-type $Al_{0.49}Ga_{0.51}As$ third cladding layer 6 (thickness of 1.28 $\mu$m). The third cladding layer 6 has a ridge-stripe structure. The third cladding layer 6 has a height of approx. 2 $\mu$m, and a maximum width of approx. 2.5 $\mu$m. More specifically, a portion of the third cladding layer 6 that is in contact with the etching stopper layer 5 has a width of approx. 2.5 $\mu$m. On both sides of the third cladding layer 6, there is provided a current blocking layer 7, which fills gaps on the lateral sides of the third cladding layer 6. The current blocking layer 7 is composed of an n-type $Al_{0.7}Ga_{0.3}As$ first buried layer 7a (thickness of 0.7 $\mu$m) and an n-type GaAs second buried layer 7b (thickness of 0.3 $\mu$m) stacked in sequence, which mainly forms a current constriction structure in which current only flows directly below the third cladding layer 6. Further, on the entire upper surfaces of the third cladding layer 6 and the current blocking layer 7, there is provided a p-type GaAs contact layer 8 (thickness of 2.0 $\mu$m).

As shown in FIG. 2, the multiple quantum well active layer 3 is composed of an i-type $Al_{0.35}Ga_{0.65}As$ guide layer 3c (thickness of 68.5 nm), $In_{0.17}Ga_{0.83}As_{0.717}P_{0.283}$ quantum well layers 3a (thickness of 8 nm), three $In_{0.09}Ga_{0.91}As_{0.42}P_{0.58}$ barrier layers 3b, and an i-type $Al_{0.35}Ga_{0.65}As$ guide layers 3d (thickness of 68.5 nm). The barrier layer 3b has a tensile strain of 0.86% with respect to the GaAs substrate 1. Among the three barrier layers 3b, the first and the third layers from the GaAs substrate 1 side have a layer thickness of 10 nm, and the second layer has a layer thickness of 5 nm. The quantum well layer 3a, which is provided between the barrier layers 3b, has a compressive strain of 0.07% with respect to the GaAs substrate 1. Herein, a band energy difference between the quantum well layer 3a and the barrier layer 3b is almost 0.4 eV.

Though not illustrated, in the case where an AlGaAs carrier block layer is provided between the guide layer 3d and the second cladding layer 4, there is provided, for example, a p-type $Al_{0.7}Ga_{0.3}As$ carrier block layer between the guide layer 3d and the second cladding layer 4. Preferably, the Al ratio in the composition of the second cladding layer 4 is set to 0.5 or more.

A semiconductor laser device of the first embodiment is a device having so-called ridge guide structure. The etching stopper layer 5 is provided so that the second cladding layer 4 is not etched when a stripe-shaped third cladding layer 6 having a trapezoidal cross section called a ridge is formed by an ordinary photolithographic method. The etching stopper layer 5 is imparted a sufficiently small thickness as thin as 0.01 $\mu$m or less so as not to absorb laser light generated in the quantum well layer 3a.

Also, since the current blocking layer 7 is as thick as 0.3 $\mu$m or more, it is preferably formed from AlGaAs free from light absorption. However, for growing a contact layer on the current blocking layer, the current blocking layer is preferably covered with GaAs that is hardly oxidized. This is why the current blocking layer 7 is composed of the n-type $Al_{0.7}Ga_{0.3}As$ first buried layer 7a and the n-type GaAs second buried layer 7b.

Also, the first buried layer 7a is made to be a crystal with the Al ratio being larger than that of the third cladding layer 6, so that laser light can be confined in the ridge portion with respect to a direction parallel to the GaAs substrate 1. In this structure, there is no light absorption in the current blocking layer 7, which increases external quantum efficiency. This reduces driving current in the case of using the device with high optical output.

The contact layer 8, which is a layer with a p-type impurity added at high concentration, is provided to have an ohmic contact with the p-side electrode 12. The contact layer 8 is provided so as to cover not only the top of the stripe-shaped ridge portion 6 but also the current blocking layer 7 for widening an electrode area of the p-side electrode 12 so that when the p-side electrode 12 is die-bonded to a stem (unshown), heat generated in the multiple quantum well active layer 3 is swiftly removed.

The semiconductor laser device in the first embodiment produces an optical output of 150 mW or more in continuous emission with an emission wavelength of 780 nm for an operating time long enough for practical application without any specific improvement on the stem or the die-bond method.

Also, use of a semiconductor laser apparatus having the semiconductor laser device mounted on the stem as a light source enables high speed write onto optical discs such as CD-R and CD-RW standards. More specifically, conventional writing speed is max. twelve times a standard write speed, whereas the writing speed of the above apparatus has reached sixteen times the standard speed.

(Second Embodiment)

Figure 4:
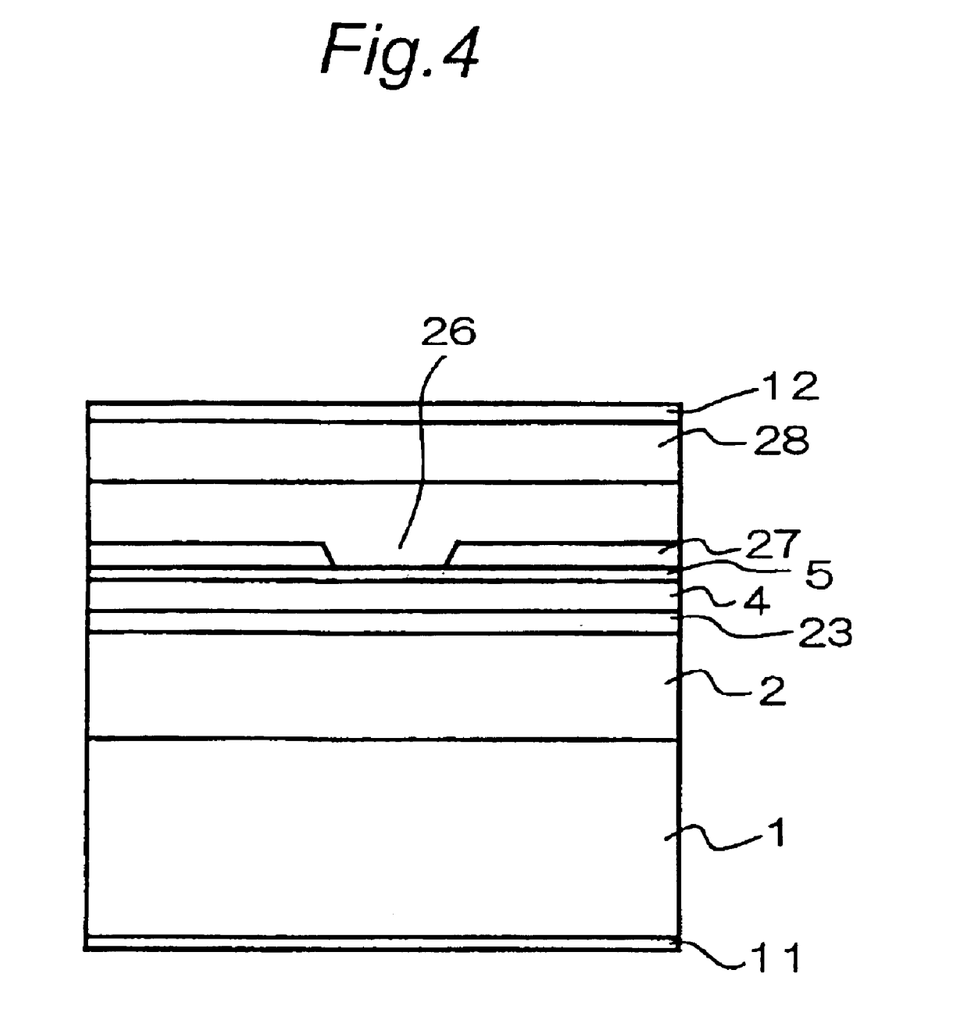
FIG. 4 is a view showing layer structure of a semiconductor laser device in a second embodiment of the present invention seen from an end face side.

FIG. 4 is a view showing crystalline layer structure of a semiconductor laser device in a second embodiment of the present invention seen from an end face side. In FIG. 4, components identical to those in the first embodiment shown in FIG. 1 are designated by reference numerals identical to those in FIG. 1.

In FIG. 4, there are shown an n-type GaAs substrate 1, an n-type $Al_{0.45}Ga_{0.55}As$ first cladding layer 2 (thickness of 3.0 $\mu$m), a multiple quantum well active layer 23 (emission wavelength of 0.78 $\mu$m), a p-type $Al_{0.49}Ga_{0.51}As$ second cladding layer 4 (thickness of 0.1967 $\mu$m), a p-type GaAs etching stopper layer 5 (thickness of 3 nm), a p-type $Al_{0.49}Ga_{0.51}As$ third cladding layer 26 (thickness of 1.28 $\mu$m), an n-type $Ak_{0.7}Ga_{0.3}As$ current blocking layer 27

(thickness of 0.7 µm), and a p-type GaAs contact layer 28 (thickness of 2.0 µm). The current blocking layer 27 has a stripe opening portion, which mainly forms a current constriction structure in which current only flows directly below the stripe opening portion. Further the third cladding layer 26 is formed so as to cover part of the etching stopper layer 5 and the current blocking layer 27.

The multiple quantum well active layer 23, though unshown, is composed of an i-type $Al_{0.4}Ga_{0.6}As$ guide layer (thickness of 35 nm), two $In_{0.20}Ga_{0.80}As_{0.71}P_{0.29}$ quantum well layers (thickness of 15 nm), three $In_{0.07}Ga_{0.93}As_{0.52}P_{0.48}$ barrier layers, and an i-type $Al_{0.4}Ga_{0.6}As$ guide layer (thickness of 35 nm). The barrier layer has a tensile strain of 0.86% with respect to the GaAs substrate 1. Among the three barrier layers, the first and the third layers from the GaAs substrate 1 side have a layer thickness of 10 nm, and the second layer has a layer thickness of 5 nm. The quantum well layers, each of which is provided between the barrier layers, has a compressive strain of 0.16% with respect to the GaAs substrate 1. The band energy difference between the quantum well layer and the barrier layer is almost 0.3 eV.

In the above-structured semiconductor laser device in the second embodiment, similar to the first embodiment, compositions of the quantum well layers and the barrier layers are properly set in accordance with FIG. 3. Also as stated before, there is adopted a temperature characteristics improvement structure outside of the quantum well structure. More specifically, a carrier block layer is introduced for the temperature characteristics improvement in the first embodiment, whereas in the second embodiment, the carrier block layer is not used, instead of which the quantum well active layer 23 is imparted a larger layer thickness and the guide layer is given a larger Al ratio. As a result, the semiconductor laser device in the second embodiment implements high-power operation satisfying specifications for CD-R semiconductor lasers as in the case of the first embodiment.

Also in the second embodiment, laser light is confined in a direction parallel to the GaAs substrate 1 with use of an internal stripe structure instead of the ridge-stripe structure. More particularly, the third cladding layer 26 is formed so as to cover the entire current blocking layer 27 having a stripe-shaped notch portion.

In producing the semiconductor laser device in the first embodiment, it is necessary to insert a photolithography step between a ridge formation step and a current blocking layer formation step, so that it is necessary to take out devices from a crystal growing apparatus. In contrast to this, in the semiconductor laser device in the second embodiment, the current blocking layer is simultaneously formed in the internal stripe formation step, so that manufacturing of devices becomes easy, although it is difficult to increase a thickness of the current blocking layer 27, which makes it difficult to increase drive voltage for achieving a high output power.

(Third Embodiment)

Figure 5A:
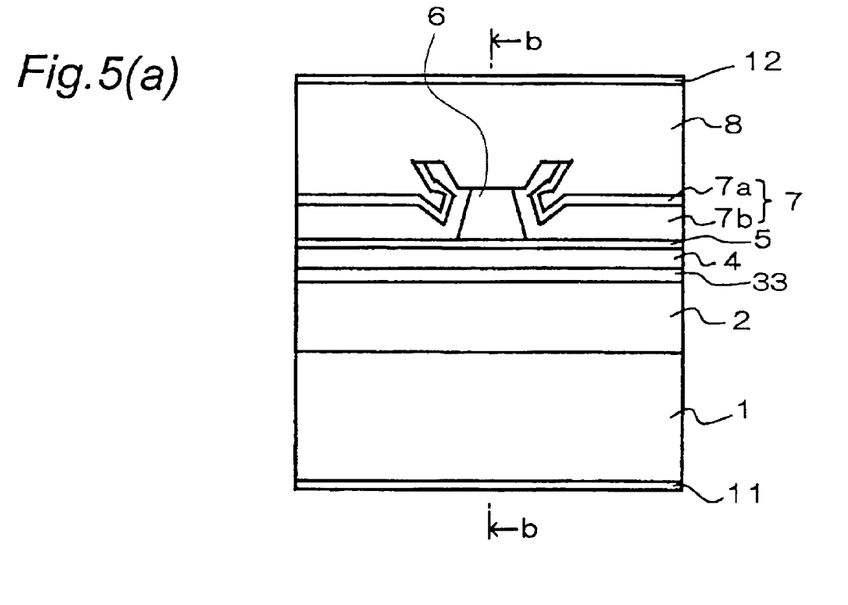
Figure 5B:
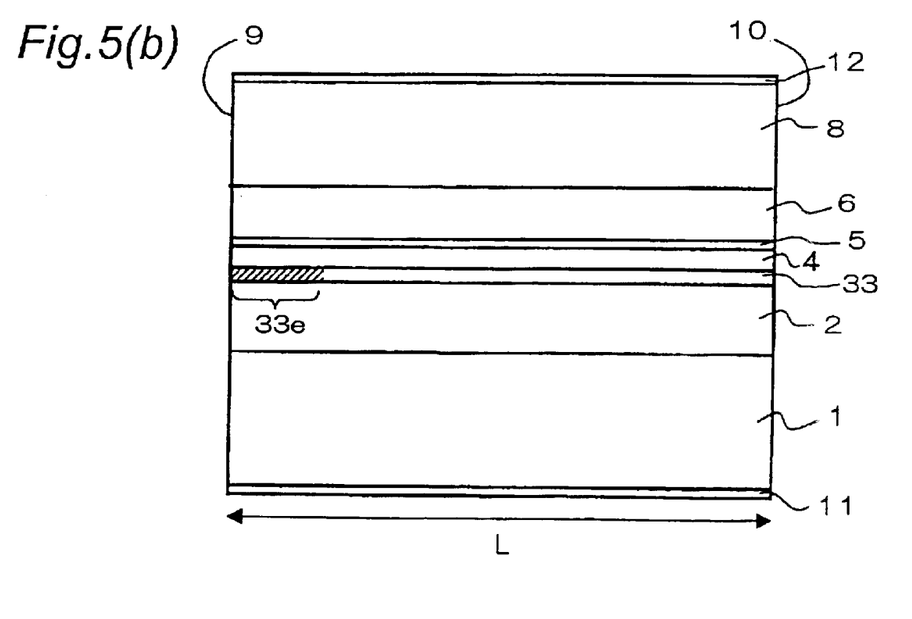
FIG. 5(b) is a cross sectional view taken along line b—b of FIG. 5(a)

FIG. 5(a) is a view showing the crystalline layer structure of a semiconductor laser device in a third embodiment of the present invention seen from an end face side, while FIG. 5(b) is a cross sectional view taken along line b—b of FIG. 5(a). In FIGS. 5(a) and 5(b), components similar to those in the first embodiment shown in FIG. 1 are designated by reference numerals identical to those in FIG. 1.

In FIG. 5(a), there are shown an n-type GaAs substrate 1, an n-type $Al_{0.43}Ga_{0.57}As$ first cladding layer 2 (thickness of 3.0 µm), a multiple quantum well active layer 33 (emission wavelength of 0.78 µm), a p-type $Al_{0.6}Ga_{0.4}As$ second cladding layer 4 (thickness of 0.1967 µm), a p-type GaAs etching stopper layer 5 (thickness of 3 nm), and a p-type $Al_{0.49}Ga_{0.51}As$ third cladding layer 6 (thickness of 1.28 µm). The third cladding layer 6 has a ridge-stripe structure. The third cladding layer 6 has a height of approx. 2.5 µm, and a maximum width of approx. 4.0 µm. More specifically, a portion of the third cladding layer 6 that is in contact with the etching stopper layer 5 has a width of approx. 4.0 µm. On both sides of the third cladding layer 6, there is provided a current blocking layer 7, which fills gaps on the lateral sides of the third cladding layer 6. The current blocking layer 7 is composed of an n-type $Al_{0.7}Ga_{0.3}As$ first buried layer 7a (thickness of 0.7 µm) and an n-type GaAs second buried layer 7b (thickness of 0.3 µm) stacked in sequence, which mainly forms a current constriction structure in which current only flows directly below the third cladding layer 6. Further, on the entire upper surfaces of the third cladding layer 6 and the current blocking layer 7, there is provided a p-type GaAs contact layer 8 (thickness of 2.0 µm).

In the above-structured semiconductor laser device in the third embodiment, similar to the first and second embodiments, compositions of the quantum well layers and the barrier layers are properly set in accordance with FIG. 3. Also, there is adopted a temperature characteristics improvement structure outside of the quantum well structure. More specifically, in the third embodiment, the number of quantum well layers is increased, i-type AlGaAs guide layers are provided, and the Al ratio in the composition of the p-type second cladding layer 4 is increased. As a result, the semiconductor laser device in the third embodiment implements high-power operation satisfying specifications for CD-R semiconductor lasers as in the first and second embodiments.

Also, as shown in FIG. 5(b), end faces 9, 10 of the semiconductor laser device in the third embodiment function as partial reflectors, which return part of laser light generated inside to the inside again to generate laser oscillation. On the end faces 9, 10, crystal structure is interrupted, so that energy bandgaps of each layer are decreased. Consequently, out of light generated inside, part of the light to pass through the end faces 9, 10 is absorbed by the crystal of the multiple quantum well active layer 33 itself, and part of the absorbed light becomes heat to increase temperature of the end faces 9, 10. Such light absorption and temperature rise are most remarkable at the end faces of the multiple quantum well active layer 33, though temperature rise also occurs in the first and second cladding layers 2, 4 as light spreads to the first and second cladding layers 2, 4. In the semiconductor laser device in the first embodiment, a large amount of Al that is susceptible to oxidization is contained in the guide layers 3c, 3d and the first and second cladding layers, 2 4, so that further increase of optical output requires further reduction of light absorption at the end faces.

Figure 6:
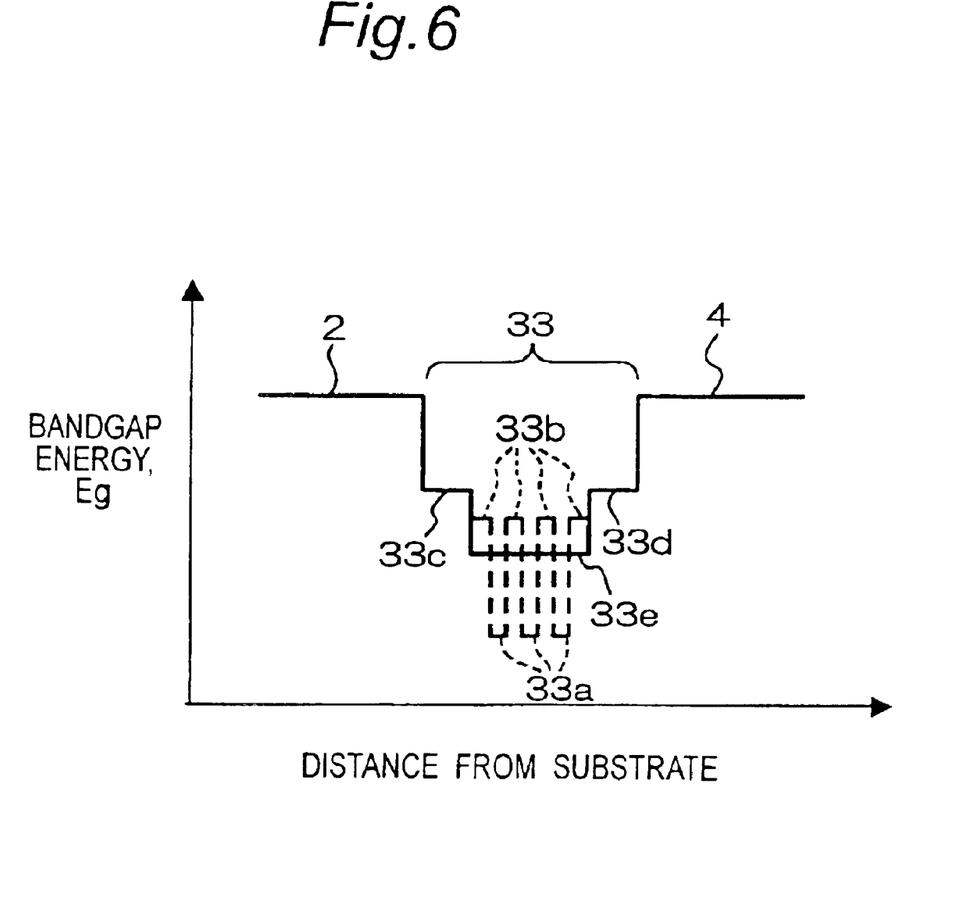
FIG. 6 is a view showing thickness and bandgap energy of each of layers constituting an active layer of the semiconductor laser device in the third embodiment, as well as positional relationship between the layers.

FIG. 6 is a view showing the thicknesses and bandgap energies of layers constituting an active layer 33e in the vicinity of the end face 9 for extracting light of the semiconductor laser device in the third embodiment.

As shown in FIG. 6, the multiple quantum well active layer 33 is composed of an i-type $Al_{0.35}Ga_{0.65}As$ guide layer 33c (thickness of 45 nm), three $In_{0.32}Ga_{0.68}As_{0.50}P_{0.50}$ quantum well layers 33a (thickness of 10 nm), four $In_{0.13}Ga_{0.87}As_{0.37}P_{0.63}$ barrier layers 33b, and an i-type $Al_{0.35}Ga_{0.65}As$ guide layers 33d (thickness of 35 nm). The barrier layers 33b have a tensile strain of 1.0% with respect to the GaAs substrate 1. Among the four barrier layers 33b, the first and the fourth layers from the GaAs substrate 1 side have a layer thickness of 10 nm, and the second and the third layers have a layer thickness of 5 nm. The quantum well layers 33a, which are provided between the barrier layers 33b, have a compressive strain of 0.14% with respect to the GaAs substrate 1. In this example, a band energy difference between the quantum well layer 33a and the barrier layer 33b is almost 0.4 eV.

As described above, the semiconductor laser device in the third embodiment has three quantum well layers 33a. In a portion 33e in the vicinity of the end face 9 of the multiple quantum well active layer 33, there is an intermixed structure in which periodicity of the quantum well layers 33a and the barrier layers 33b disappears, and the bandgap energy assumes an average value between the quantum well layer 33a and the barrier layer 33b. Such an intermixed structure may be formed by diffusing zinc (Zn) from the surface of the etching stopper layer 5 to the portion along the end face 9. Diffused Zn destroys the periodic structure of the quantum well layers 33a and the barrier layers 33b and transforms them to a crystal having a uniform composition as a whole. In other words, the quantum well structure is destroyed, so that the bandgap energy in the vicinity of the end face 9 becomes as shown in FIG. 6.

Also, while the semiconductor laser device has a resonator length L of L=600 μm, the portion 33e at which the quantum well structure is destroyed has a length of approx. 20 μm from the end face 9. This is because the portion whose quantum well structure is destroyed has no gain for laser oscillation, so that making the portion too long disadvantageously increases an oscillation threshold value Ith.

If the composition of the quantum well layer 33a is set at point Zc in FIG. 3 and the composition of the barrier layer 33b is set at point Zd in FIG. 3, the portion 33e in the vicinity of the end face 9 of the multiple quantum well active layer 33 has an average composition, i.e., a composition at a point close to point Zg where strain is not present. Therefore, even if the portion 33e in the vicinity of the end face 9 has a thickness of, for example, 0.05 μm, crystal destruction and generation of defects do not occur. This makes it possible to obtain a so-called window structure which eliminates light absorption by the portion 33e in the vicinity of the end face 9 of the multiple quantum well active layer 33 without deterioration of the crystal, which enables implementation of a semiconductor laser device with higher optical output.

In the third embodiment, the periodic structure between the quantum well layers 33a and the barrier layers 33b is made to disappear only in the portion 33e in the vicinity of the end face 9 of the multiple quantum well active layer 33. However, in both the portion 33e in the vicinity of the end face 9 of the multiple quantum well active layer 33 and a portion in the vicinity of the other end face 10 of the multiple quantum well active layer 33, the periodic structure between the quantum well layers 33a and the barrier layers 33b may be disappeared. Further, between the guide layer 33d and the second cladding layer 4, there may be provided a carrier block layer as described in the first embodiment.

Application of the semiconductor laser device in the third embodiment to optical disc systems makes it possible to realize CD-R and CD-RW systems with a higher writing speed.

(Fourth Embodiment)

Figure 9:
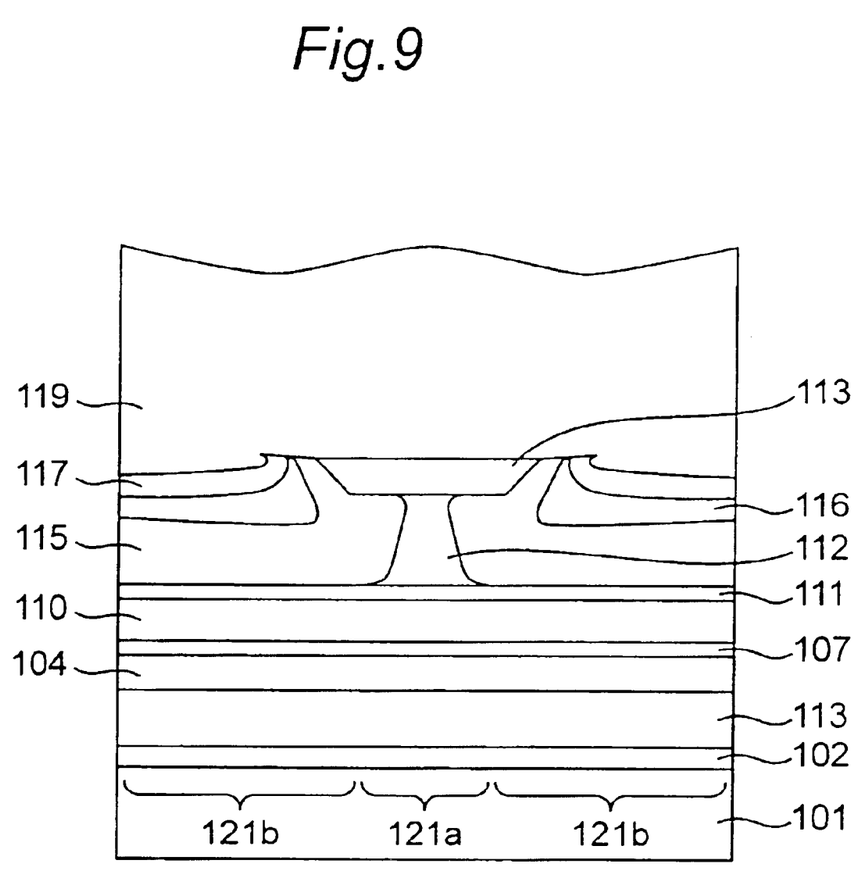
FIG. 9 is a view showing layer structure of a semiconductor laser device in a fourth embodiment of the present invention seen from an end face side.

FIG. 9 is a view showing the crystalline layer structure of a semiconductor laser device in a fourth embodiment of the present invention seen from an end face side. In this semiconductor laser device, on an n-GaAs substrate 101, there are stacked in sequence an n-GaAs buffer layer 102 (layer thickness of 0.5 μm), an n-$Al_{0.452}Ga_{0.548}As$ first lower cladding layer 103 (layer thickness of 3.0 μm), an n-$Al_{0.532}Ga_{0.468}As$ second lower cladding layer 104 (layer thickness of 0.12 μm), a multiple quantum well active layer 107, a p-$Al_{0.4885}Ga_{0.5115}As$ first upper cladding layer 110 (layer thickness of 0.13 μm), and a p-GaAs etching stopper layer 111 (layer thickness of 30 Å). The n-type first lower cladding layer 103 and second lower cladding layer 104 constitute a first-conductivity-type first cladding layer, while the p-type first upper cladding layer 110 constitutes a second-conductivity-type second cladding layer. Also, on the etching stopper layer 111, there are provided a mesa stripe-shaped p-$Al_{0.4885}Ga_{0.5115}As$ second upper cladding layer 112 (layer thickness of 1.28 μm) and an eaves-shaped GaAs cap layer 113 (layer thickness of 0.75 μm), the latter serving as a second-conductivity-type third cladding layer, and both sides of the second upper cladding layer 112 and the GaAs cap layer 113 are filled with an n-$Al_{0.7}Ga_{0.3}As$ first current blocking layer 115 (layer thickness of 1.0 μm), an n-GaAs second current blocking layer 116 (layer thickness of 0.3 μm), and a p-GaAs planarization layer 117 (layer thickness of 0.65 μm), which layers define a light and current constriction area. Further, a p-GaAs contact layer 119 is provided on the entire surface. Also, though not shown, a p-type electrode is provided on the contact layer 119, and an n-type electrode is provided on the rear face of the substrate 101. The semiconductor laser device has a mesa stripe portion 121a and lateral portions 121b provided on both lateral sides of the mesa stripe portion 121a, and a lowermost portion of the mesa stripe portion 121a has a width of approx. 2.5 μm.

Though not shown, the multiple quantum well active layer 107 has a layer structure having, from the substrate side, an $Al_{0.4278}Ga_{0.5722}As$ lower guide layer (layer thickness of 2200 Å), a compressively strained multiple quantum well active area composed of two $In_{0.2655}Ga_{0.7345}As_{0.5914}P_{0.4086}$ compressively strained quantum well layers (strain of 0.466%, each layer having a thickness of 50 Å) and three $In_{0.1260}Ga_{0.8740}As_{0.4071}P_{0.5929}$ barrier layers (strain of −1.20%, the layers having a thickness of 90 Å, 50 Å, and 90 Å, respectively) disposed alternately, and an $Al_{0.4278}Ga_{0.5722}As$ upper guide layer (layer thickness of 1500 Å).

In the present embodiment, stable operation for 5000 hours or more was confirmed in reliability tests under the conditions of: an emission wavelength of 780 nm; a temperature of 70° C., and a pulse of 230 mW. This result is attributable to a proper combination of the compositions of the quantum well layers and the barrier layers in accordance with the composition chart of FIG. 3, as done in the first, second and third embodiments. Thus, the semiconductor laser device in the fourth embodiment can perform a high-power operation satisfying the specifications for CD-R semiconductor lasers as in the case of the first, second, and the third embodiments, and application of the semiconductor laser device in the fourth embodiment to optical disc systems makes it possible to realize CD-R and CD-RW systems with a higher writing speed.

Although the fourth embodiment has a buried ridge structure, the present invention is not limited thereto. The same effect may be achieved in any structure including ridge structure, internal stripe structure, and buried heterostructure.

Also, a carrier block layer may be provided between the active layer 107 and the first upper cladding layer 110.

Although an n-type substrate is used in the present embodiment, the same effect may be achieved by using a p-type substrate and replacing the n type and the p type of the layers in the above embodiment.

The semiconductor laser devices in the above first to fourth embodiments can continuously produce output as high as 150 mW or more with emission wavelength of 780 nm with little deterioration, and therefore they are preferable as a light source of optical disc systems capable of writing or rewriting at a high speed, such as systems for optical discs such as CD-R and CD-RW.

It is understood that the semiconductor laser device of the present invention is not limited to the ones described above and illustrated in the accompanying drawings, and naturally numerous modifications are possible, such as a layer thickness of the well layer and barrier layer and the number thereof, without departing from the spirit of the invention.

As is apparent from the above description, in the semiconductor laser device of the present invention, the proportion of P in V-group elements in the barrier layer is made larger than the proportion of P in V-group elements in the well layer, the proportion of In in III-group elements in the barrier layer is made smaller than the proportion of In in III-group elements in the well layer, so that the barrier layer has a tensile strain with respect to the GaAs substrate, and the well layer has a compressive strain with respect to the GaAs substrate. This makes it possible to produce higher optical output for a practically sufficient operating time even if Al is not contained in the active layer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device having a first-conductivity-type first cladding layer, an active layer, and a second-conductivity-type second cladding layer supported by a first-conductivity-type GaAs substrate and formed in this order, each of said layers comprising a III-V-group compound semiconductor, the active layer having at least one well layer and barrier layers having an energy bandgap larger than the well layer, the well layer being interposed between the barrier layers, wherein the well layer and the barrier layers each include P and As as V-group elements and Ga and In as III-group elements;

a proportion of P in the V-group elements in the barrier layers is larger than a proportion of P in the V-group elements in the well layer;

a proportion of In in the III-group elements in the barrier layers is smaller than a proportion of In in the III-group elements in the well layer;

the barrier layers have a tensile strain with respect to the GaAs substrate;

the well layer has a compressive strain with respect to the GaAs substrate; and the semiconductor laser device has an emission wavelength of approx. 780 nm.

2. The semiconductor laser device as defined in claim 1, wherein the proportion of In in the III-group elements in the barrier layers is 0.15 or less.

3. The semiconductor laser device as defined in claim 1, wherein an absolute value of the tensile strain of the barrier layers with respect to the GaAs substrate is larger than an absolute value of the compressive strain of the well layer with respect to the GaAs substrate.

4. The semiconductor laser device as defined in claim 1, wherein two or more well layers are provided and a barrier layer is present between the adjacent well layers.

5. The semiconductor laser device as defined in claim 1, further comprising AlGaAs guide layers each formed between an active area composed of the well and barrier layers and the first and second cladding layers, respectively, wherein a proportion of Al in the AlGaAs guide layer is 0.3 or more.

6. The semiconductor laser device as defined in claim 5, further comprising an AlGaAs carrier block layer formed between one AlGaAs guide layer and the second cladding layer, wherein a proportion of Al in the AlGaAs carrier block layer is 0.6 or more and less than 0.85, and the first conductivity type is an n type, and the second conductivity type is a p type.

7. The semiconductor laser device as defined in claim 6, wherein a proportion of Al in the second cladding layer is 0.5 or more.

8. The semiconductor laser device as defined in claim 1, further comprising:

a second-conductivity-type GaAs etching stopper layer formed on the second cladding layer;

a first-conductivity-type current blocking layer formed on the GaAs etching stopper layer and defining a stripe-shaped notch portion;

a second-conductivity-type third cladding layer filling the stripe-shaped notch portion; and a contact layer formed so as to cover the third cladding layer and the current blocking layer.

9. The semiconductor laser device as defined in claim 1, wherein the at least one well layer and the barrier layers are intermixed in a portion of the active layer adjacent to at least one of two end faces of the device.

10. A semiconductor laser device having a first-conductivity-type first cladding layer, an active layer, and a second-conductivity-type second cladding layer supported by a first-conductivity-type GaAs substrate and formed in this order, each of said layers comprising a III-V-group compound semiconductor, the active layer having at least one well layer and barrier layers having an energy bandgap larger than the well layer, the well layer being interposed between the barrier layers, wherein the well layer and the barrier layers each include P and As as V-group elements and Ga and In as III-group elements;

a proportion of P in the V-group elements in the barrier layers is larger than a proportion of P in the V-group elements in the well layer;

a proportion of In in the III-group elements in the barrier layers is smaller than a proportion of In in the III-group elements in the well layer;

the barrier layers have a tensile strain with respect to the GaAs substrate; and the well layer has a compressive strain with respect to the GaAs substrate.

11. The semiconductor laser device as defined in claim 10, further comprising an AlGaAs carrier block layer formed between one AlGaAs guide layer and the second cladding layer, wherein a proportion of Al in the AlGaAs carrier block layer is 0.6 or more and less than 0.85, and the first conductivity type is an n type, and the second conductivity type is a p type.

12. The semiconductor laser device as defined in claim 10, wherein the at least one well layer and the barrier layers are intermixed in a portion of the active layer adjacent to at least one of two end faces of the device.

* * * * *